(12) United States Patent
Tong et al.

(10) Patent No.: US 8,238,073 B2
(45) Date of Patent: Aug. 7, 2012

(54) IN-MOLDED CAPACITIVE SENSORS

(75) Inventors: Tony Tong, Santa Clara, CA (US);
David Dwight Kellogg, Boulder, CO (US)

(73) Assignee: Synaptics, Inc., Santa Clara, CA (US)

( * ) Notice: Subject to any disclaimer, the term of this patent is extended or adjusted under 35 U.S.C. 154(b) by 1054 days.

(21) Appl. No.: 12/176,268

(22) Filed: Jul. 18, 2008

(65) Prior Publication Data

US 2010/0013499 A1 Jan. 21, 2010

(51) Int. Cl.
*H01G 5/00* (2006.01)
(52) U.S. Cl. ........ 361/277; 361/272; 361/273; 361/278; 361/283.1; 361/286
(58) Field of Classification Search ................... 361/277, 361/278–279, 272–273, 282, 283.1, 286, 361/290–292
See application file for complete search history.

(56) References Cited

U.S. PATENT DOCUMENTS

| | | | |
|---|---|---|---|
| 4,912,288 A | 3/1990 | Atkinson et al. | |
| 5,003,693 A | 4/1991 | Atkinson et al. | |
| 5,239,152 A * | 8/1993 | Caldwell et al. | ............. 200/600 |
| 5,979,043 A | 11/1999 | Baker et al. | |
| 6,197,145 B1 | 3/2001 | Todd et al. | |
| 6,897,390 B2 | 5/2005 | Caldwell et al. | |
| 7,254,008 B2 * | 8/2007 | Xie et al. | ................... 361/283.1 |
| 7,509,870 B2 * | 3/2009 | Aebersold et al. | ............. 73/780 |
| 7,539,003 B2 * | 5/2009 | Ray et al. | ..................... 361/277 |
| 2010/0159183 A1 * | 6/2010 | Nishimura | ..................... 428/77 |

FOREIGN PATENT DOCUMENTS

EP 0424796 5/1991

OTHER PUBLICATIONS

Marabu, "Customer Information—In-Mold Decoration", *enk/fa Customer Information*, (Feb. 11, 1998), 7 pages.

* cited by examiner

*Primary Examiner* — Nguyen T Ha (57) ABSTRACT

In a method for forming an in-molded capacitive sensing device a plastic film is provided, the plastic film comprising a first side and a second side. A capacitive sensor pattern is disposed on at least a portion of the second side, the capacitive sensor pattern including a region for facilitating electrical contact. A resin layer is printed over a portion of the capacitive sensor pattern such that access to the region for facilitating electrical contact is maintained. A plastic layer is injection molded onto a portion of the resin layer such that the capacitive sensor pattern becomes in-molded between the plastic film and the plastic layer while access to the region for facilitating electrical contact is maintained.

10 Claims, 11 Drawing Sheets

---
DISPOSING A COSMETIC DESIGN BETWEEN THE PLASTIC FILM AND THE PLASTIC LAYER, SUCH THAT THE COSMETIC DESIGN IS VISIBLE THROUGH AN EXTERIOR SURFACE OF THE IN-MOLDED CAPACITIVE SENSING DEVICE.
550

---

DISPOSING A PROTECTIVE LAMINATE SHEET BETWEEN THE CAPACITIVE SENSOR PATTERN AND THE RESIN LAYER SUCH THAT ACCESS TO THE REGION FOR FACILITATING ELECTRICAL CONTACT IS MAINTAINED.
560

IN-MOLDED CAPACITIVE SENSORS

BACKGROUND

Capacitive sensing devices, otherwise known as touch sensing devices or proximity sensors are widely used in modern electronic devices/apparatus. A capacitive sensing device is often used for touch based navigation, selection, or other input, in response to a finger, stylus, or other object being placed on or in proximity to a sensor of the capacitive sensing device. In such a capacity, capacitive sensing devices are often employed in computers (e.g. notebook/laptop computers), touch screens, media players, multi-media devices, remote controls, personal digital assistants, smart devices, telephones, control consoles, and the like.

In many of these instances, a capacitive sensor is coupled with a surface that is manufactured separately from the capacitive sensor. That is, the capacitive sensor is added after-the-fact to a previously manufactured surface. Adding capacitive sensors to surfaces, and particularly to surfaces with complex shapes, is challenging and often involves numerous manufacturing steps. Often the end result, particularly in the case of surfaces with complex shapes such as compound curves, is that a capacitive sensor is restricted to being located in only a limited portion of the surface. In other instances, the thickness or shape of a surface to which a capacitive sensor is coupled can limit the effectiveness of the capacitive sensor. For instance, conventional techniques of coupling a capacitive sensor with a surface often complicate user access to and interaction with the capacitive sensor, or a portion thereof, due to the shape and/or thickness of a portion of the surface. Similarly, in conventional techniques of coupling a capacitive sensor with a surface, the sensing capability of the capacitive sensor, or a portion thereof, can be altered or disrupted by the shape and/or thickness of a portion of the surface. For example, a conventional capacitive sensor installed in conjunction with a curved surface may not uniformly sense inputs at certain portions due to the varying shape and/or thickness of the surface causing non-uniform user access the sensor.

SUMMARY

In a method for forming an in-molded capacitive sensing device a plastic film is provided, the plastic film comprising a first side and a second side. A capacitive sensor pattern is disposed on at least a portion of the second side, the capacitive sensor pattern including a region for facilitating electrical contact. A resin layer is printed over a portion of the capacitive sensor pattern such that access to the region for facilitating electrical contact is maintained. A plastic layer is injection molded onto a portion of the resin layer such that the capacitive sensor pattern becomes in-molded between the plastic film and the plastic layer while access to the region for facilitating electrical contact is maintained.

BRIEF DESCRIPTION OF THE DRAWINGS

The accompanying drawings, which are incorporated in and form a part of this specification, illustrate example embodiments of the subject matter described herein and, together with the description, serve to explain principles discussed below.

The drawings referred to below and in the detailed description should not be understood as being drawn to scale unless specifically noted.

DETAILED DESCRIPTION

Reference will now be made in detail to embodiments of the presented technology, examples of which are illustrated in the accompanying drawings. While the presented technology will be described in conjunction with embodiments, it will be understood that the descriptions are not intended to limit the presented technology to these embodiments. On the contrary, the descriptions are intended to cover alternatives, modifications and equivalents, which may be included within the spirit and scope as defined by the appended claims. Furthermore, in the following detailed description, numerous specific details are set forth in order to provide a thorough understanding of the presented technology. However, it will be obvious to one of ordinary skill in the art that the presented technology may, in some embodiments, be practiced without these specific details. In other instances, well known methods, procedures, components, and circuits have not been described in detail as not to unnecessarily obscure aspects of the presented technology.

Overview of Discussion

In various embodiments, the plastic embedded capacitive sensors described herein provide a means for including cosmetic surface designs and cosmetic embedded designs along with an in-molded capacitive sensor. As discussed herein, an in-molded/plastic embedded capacitive sensor becomes an integral portion of a surface or part and is manufactured into the surface or part, rather than being added after-the-fact. The technology and techniques described herein allow surfaces and/or parts with complex shapes, such as compound curves, to include embedded capacitive sensors in the manufacture of such surfaces and/or parts. This reduces or eliminates issues caused by varying thicknesses or shapes of a surface, which might otherwise restrict the location of a capacitive sensor, reduce the effectiveness of a capacitive sensor, or limit the ability of a user to interact with the capacitive sensor.

Herein, the terms "in-molded" and "plastic embedded" are used interchangeably to refer to a capacitive senor/sensing device which is substantially or completely encased via a plastic injection molding process.

Discussion will begin with a description of a blow-apart diagram of an example plastic embedded capacitive sensor. Description of various and alternative component parts and the assembled version of the plastic embedded capacitive sensor will follow. Discussion will then focus on example configurations for facilitating electrical contact with one or more regions of a capacitive sensor incorporated in a plastic embedded capacitive sensor. An example of an electronic apparatus configured with a plastic embedded capacitive sensor will be described. Discussion will then be directed toward an example method for forming an in-molded capacitive sensing device. Finally, an example process for creating a plastic embedded capacitive sensor will be described.

Plastic Embedded Capacitive Sensor

Figure 1A:
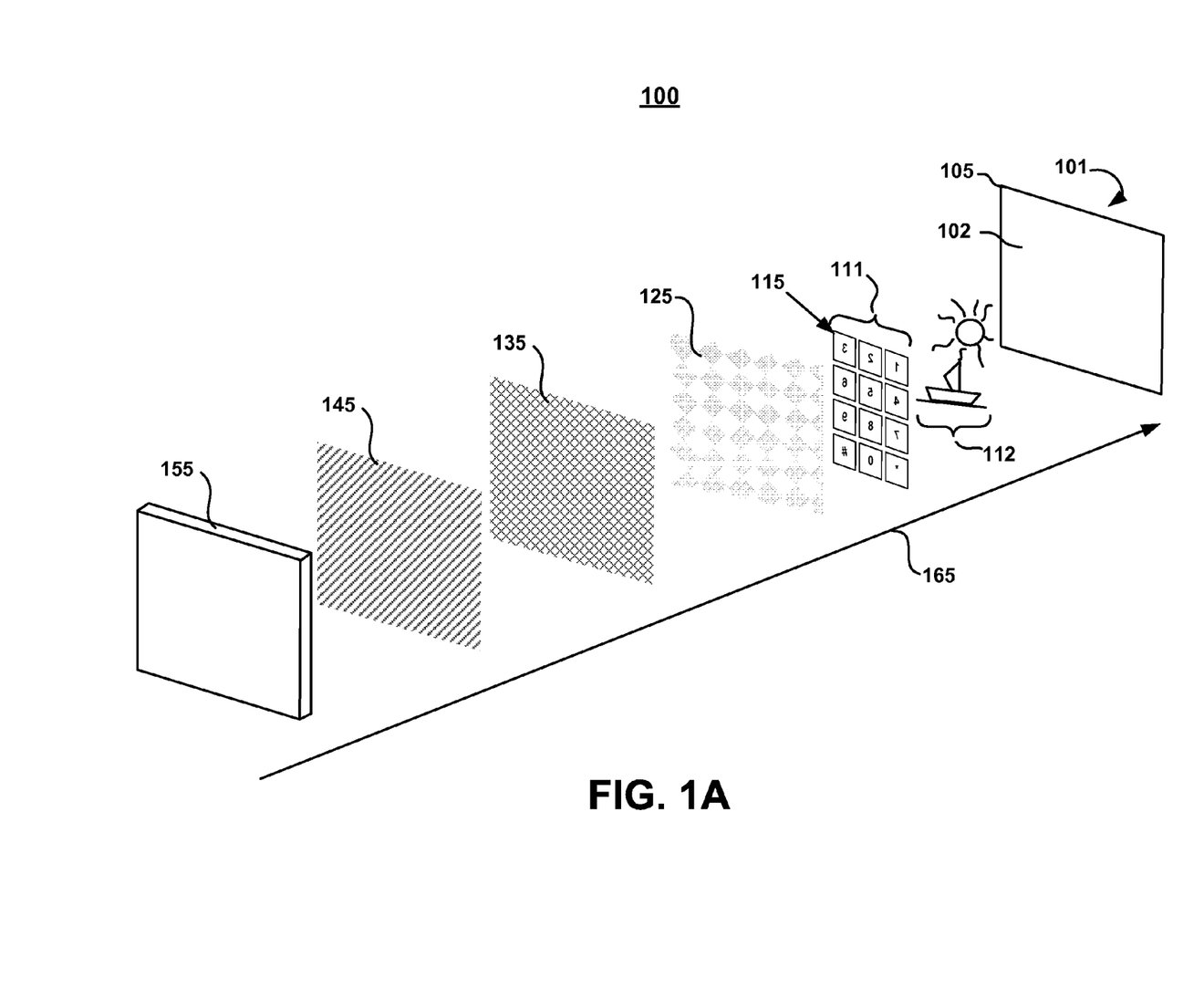
FIG. 1A is blow-apart diagram of an example plastic embedded capacitive sensor, according to an embodiment.

FIG. 1A is blow-apart diagram of an example plastic embedded capacitive sensor 100, according to an embodiment. For clarity in description, the layers of in-molded/embedded capacitive sensor 100 have been shown independently. It is appreciated that in some embodiments, not all of the shown layers need be included, that some additional layers may be included, and the order of some layers may be altered. As shown in FIG. 1A, in one embodiment, plastic embedded capacitive sensor 100 includes a plastic film 105 comprising a first side (side 101) and a second side (side 102), a cosmetic design 115, a capacitive sensor pattern 125, a laminate 135, a resin layer 145, and an injection molded plastic layer 155. Arrow 165 shows a direction of assembly of an assembled version of plastic embedded capacitive sensor 100, typically beginning with plastic film 105 and ending with injection molded plastic layer 155.

Plastic film 105 can be any type of plastic film usable in an in-mold plastic decoration forming process. One example of such a film is a polycarbonate film. In some embodiments, plastic film 105 is intended to provide a permanent exterior surface (e.g., side 101). In other embodiments, plastic film 105 is configured for removal (such as by peeling or chemical etching or other action) subsequent to the formation/manufacture of plastic embedded capacitive sensor 100. In some embodiments, such as when cosmetic design 115 is used, plastic film 105 allows transmission of light such that cosmetic design 115 is visible when viewed through side 101 of plastic film 105. For example, in some embodiments plastic film 105 comprises a transparent or translucent plastic film material such that cosmetic design 115 it is visible through plastic film 105 when plastic film 105 is viewed from side 101.

Cosmetic design 115 is disposed, in one embodiment, between plastic film 105 and injection molded plastic layer 155. For example, in one embodiment, cosmetic design 115 is disposed on side 102 of plastic film 105. In one embodiment, cosmetic design 115, when utilized, is visible through an exterior surface, such as side 101, of plastic embedded capacitive sensor 100. In another embodiment, where plastic film 105 is removed after assembly of plastic embedded capacitive sensor 100, cosmetic design 115 is visible on or through an exterior surface of plastic embedded capacitive sensor 100. A technique such as screen printing can be used for disposing cosmetic design 115 on side 102. It is appreciated that cosmetic design 115 is not required to be included, and can be omitted in some embodiments of plastic embedded capacitive sensor 100.

With reference to FIG. 1A, cosmetic design 115 is shown as comprising an image 112 of a sailboat and the sun along with demarcations 111 (in the configuration of a keypad) related to use of the capacitive sensor pattern. Image 112 is shown for purposes of example and not of limitation, and it is appreciated that any image or color may be used. Likewise, demarcations 111 are shown for purposes of example and not of limitation, and a variety of demarcations related to use (e.g., alphanumeric indicator demarcations, directional indicator demarcations, button demarcations, and the like) may be employed. Image(s) 112 and demarcation(s) 111 may appear together in a cosmetic design 115 or be used independently of one another. It is appreciated that cosmetic design 115 is typically disposed in a reversed fashion so that items such as text and numbers will appear normal (not reversed) when viewed through side 101 of plastic film 105.

Capacitive sensor pattern 125 is embedded between side 102 and injection molded plastic layer 155 such that access to a region of capacitive sensor pattern 125 is maintained for facilitating electrical contact with the capacitive sensor pattern. This access is maintained so that electronics may be coupled with capacitive sensor pattern 125 for the purpose of sensing objects which touch or come into proximity with a sensing region of an assembled plastic embedded capacitive sensor 100. Capacitive sensor pattern 125, in one embodiment, is disposed on side 102. In another embodiment, capacitive sensor pattern 125 is disposed upon on cosmetic design 115.

In one embodiment, capacitive sensor pattern 125 comprises a clear conductive material. For example, in one instance, capacitive sensor pattern 125 is disposed by printing (e.g., screen printing) a conductive polymer in a desired conductive pattern. In one embodiment, such a polymer is clear in coloration. In another embodiment, capacitive sensor pattern 125 is disposed through patterning a conductive material such as ITO (indium tin oxide) on a thermoplastic polymer substrate such as a PET (polyethylene terephthalate) substrate. In some instances this conductive material (e.g., ITO) comprises a water clear conductive coating.

It is appreciated that a capacitive sensor pattern 125 may comprise several layers of conductive and insulating materials. For example, in one embodiment a capacitive sensor pattern 125 that supports two-dimensional sensing of objects is built up from one or more ITO+PET layers. When two or more ITO+PET layers are used, they are laminated together, such as with optically clear adhesive. In some embodiments the ITO is disposed into capacitive sensor pattern 125 via a sputtering process. Clear materials are typically employed in creating capacitive sensor pattern 125 when it is desired for cosmetic design 115 to be visible, the coloration of injection molded plastic layer 155 to be visible, or any other object to be visible either through side 101 or other exterior surface of plastic embedded capacitive sensor 100.

In one embodiment, a region for electrically accessing and coupling with capacitive sensor pattern 125 is disposed contemporaneously with the disposition of capacitive sensor pattern 125. Such a region is used for connecting capacitive sensor pattern 125 to a substrate with electronic components, such as an Application Specific Integrated Controller (ASIC), that are configured for interpreting whether and/or where an object touches or comes into proximity with the sensing region (capacitive sensor pattern 125) of plastic embedded capacitive sensor 100. For example, conductive ink pads and/or traces may be incorporated into or proximate to capacitive sensor pattern 125. Pads can be incorporated in one or more designated regions of capacitive sensor pattern 125. Such traces and/or pads may be disposed in one or more regions of capacitive sensor pattern 125 or in a region of plastic film 105 which is configured as a film tail. In one embodiment, conductive pads are used for coupling capacitive sensor pattern 125 with a cable or circuit through soldering, such as, for example hot bar soldering. In some embodiments, a film tail comprises a separate part that is coupled to plastic film 105 and/or conductive sensor pattern 125. Such coupling can be accomplished with the application of heat, adhesive, and/or anisotropic conductive film or paste. Some examples of regions for facilitating electrical contact with conductive sensor pattern 125 will be described in conjunction with FIGS. 3A, 3B, 3C, and 3D.

It is also appreciated that in some embodiments, the order of cosmetic design 115 and capacitive sensor pattern 125 can be reversed such that capacitive sensor pattern 125 is disposed on side 102 and cosmetic design 115 is then disposed, such as by screen printing, on capacitive sensor pattern 125. In such an embodiment, cosmetic design 115 will still be visible through side 102 of plastic film 105 when capacitive sensor pattern 125 is formed from clear materials.

Laminate 135 is disposed, in some embodiments, between plastic film 105 and resin layer 145. The use of laminate 135 is not required in every embodiment. Laminate 135 can be employed to provide additional structure to a portion of plastic embedded capacitive sensor 100 which is not fully sandwiched between plastic film 105 and injection molded plastic layer 155. For instance, in one embodiment, laminate 135 is incorporated in plastic embedded capacitive sensor 100 to provide structural stability in a region where injection molded plastic layer 155 is not used. Such a region can be in the form of a cutout, overhang, or other region, such as an extended edge region of side 102 of plastic film 105 that is not covered (backed) by injection molded plastic layer 155. Additionally or alternatively, laminate 135 can be utilized to protect the continuity of conductive traces from breaking during the manufacturing molding process. This protective use of laminate 135 is described in conjunction with FIG. 3C.

Figure 2:
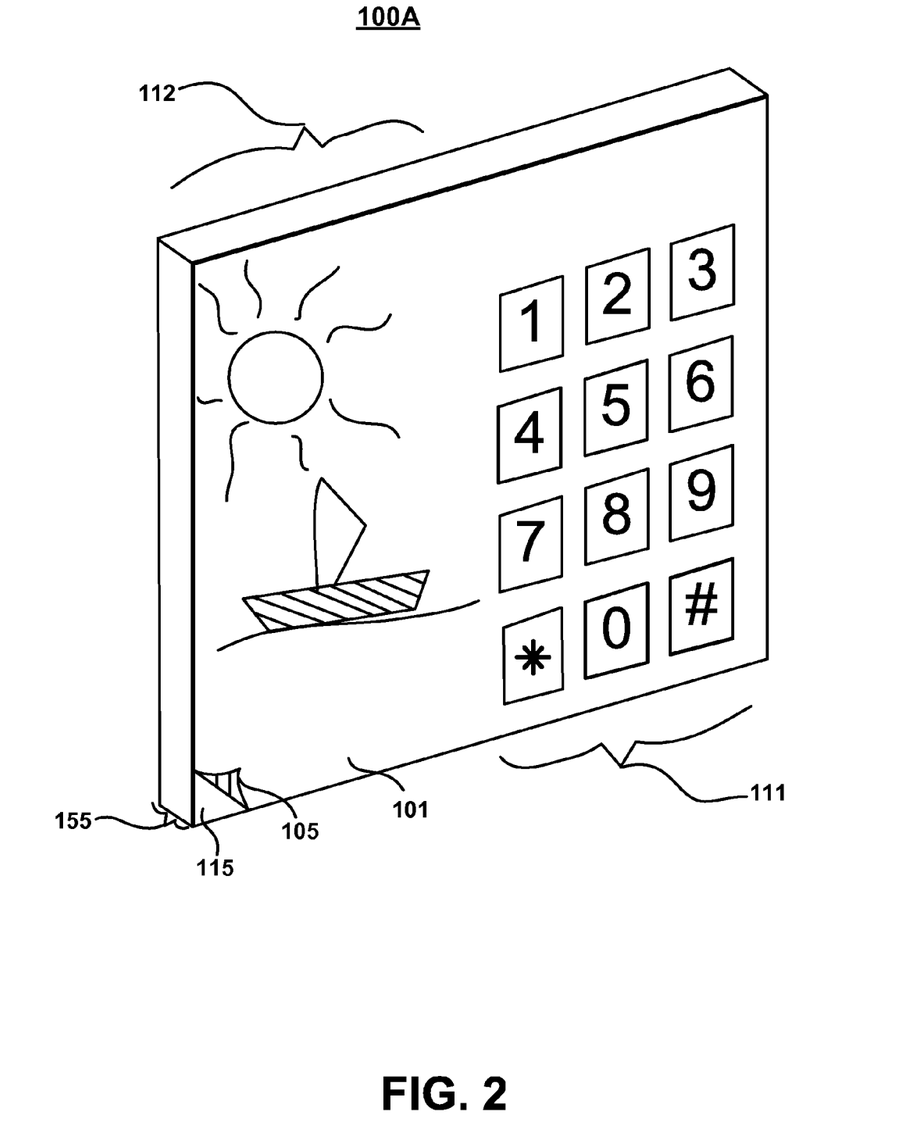
FIG. 2 is a front perspective view of an example plastic embedded capacitive sensor, according to an embodiment.

Resin layer 145 allows for injection molded plastic layer 155 to bond permanently to the construction that has been built up from plastic film 105 (e.g., the construction comprising plastic film 105, capacitive sensor pattern 125, and in some instances cosmetic design 115, laminate 135 and/or barrier layer 140 (see FIG. 2). Resin layer 145 assists in the bonding of injection molded plastic layer 155 during the injection molding. Numerous materials can be used for resin layer 145. Some examples are resins which include polycarbonate and resin blends which include polycarbonate. However, resins which do not include polycarbonate can also be utilized as resin layer 145. In some embodiments the resin of resin layer 145 is partially or completely absorbed into injection molded plastic layer 155. In some embodiments, a portion of capacitive sensor pattern 125 is not covered with resin layer 145 so as to facilitate a region for electrical access to capacitive sensor pattern 125. Such a region can be in the form of a cutout, overhang, or other region, such as an extended edge region of side 102 of plastic film 105 that is not covered (backed) by injection molded plastic layer 155.

Injection molded plastic layer 155 is a molded plastic such as a thermoform plastic material. Injection molded plastic layer 155 is injected molded to sandwich a variety of layers, such as cosmetic design 115, capacitive sensor pattern 125, resin layer 145, and/or laminate 135 between side 102 and injection molded plastic layer 155. It is appreciated that prior to the addition of injection molded plastic layer 155, plastic film 105 and the other layers may be thermal or vacuum formed in order to take on the contours of a final plastic piece.

Figure 1B:
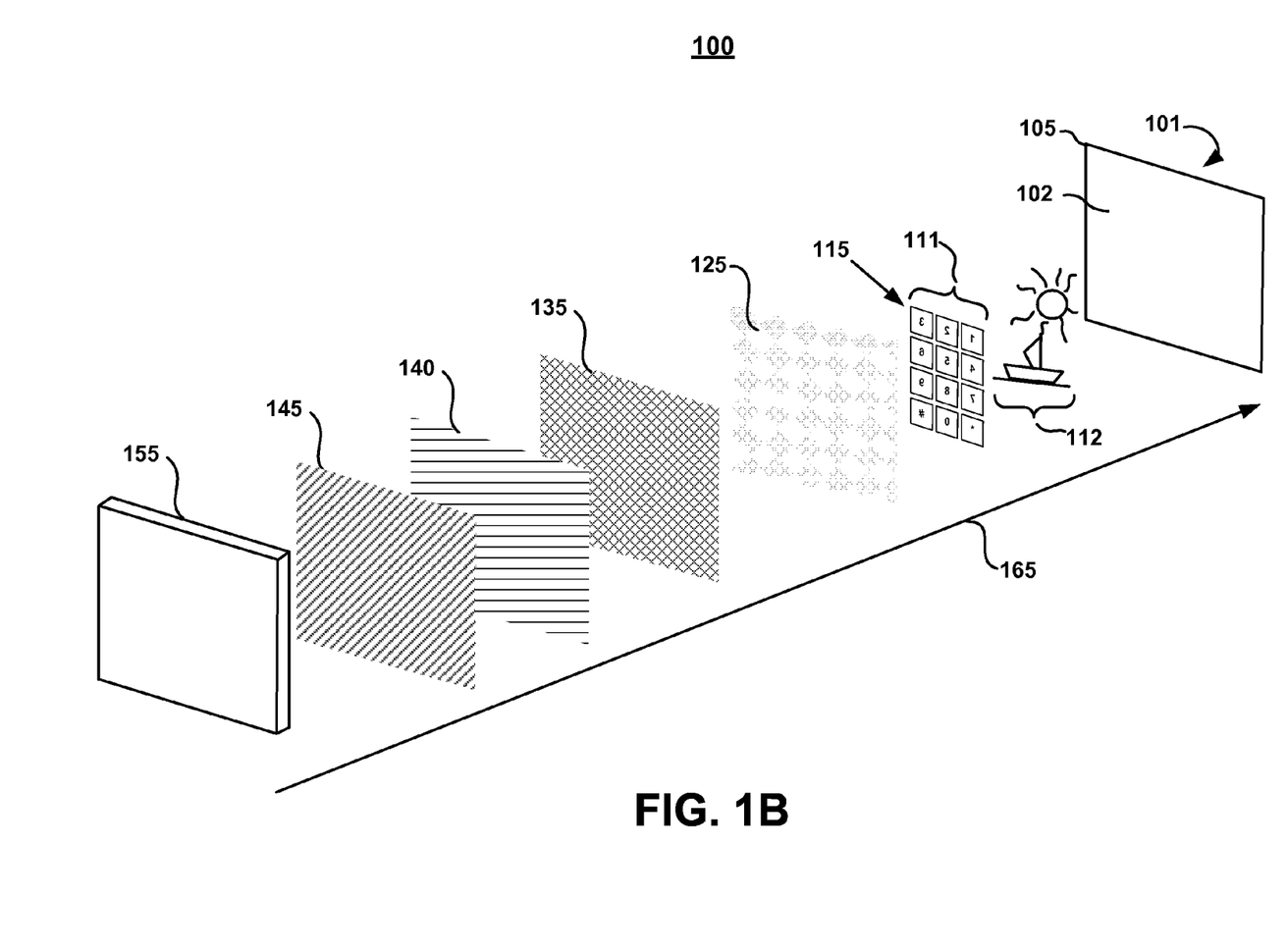
FIG. 1B is blow-apart diagram of an example plastic embedded capacitive sensor, according to an embodiment.

FIG. 1B is blow-apart diagram of an example plastic embedded capacitive sensor 100, according to an embodiment. FIG. 1B is the same as FIG. 1A except that a barrier layer 140 has been included. In some embodiments, a barrier layer, such as barrier layer 140, is printed between resin layer 145 and laminate 135/capacitive sensor pattern 125. Numerous materials can be used for barrier layer 140. For example, a plastic film, similar or identical to plastic layer 105 can be utilized; an adhesion agent such as AquaPress® ME can be used; or a combination of a plastic film and adhesion agent can be used. When utilized, barrier layer 140 provides additional protection from the high temperatures of injection molded plastic (e.g. from the addition of injection molded plastic layer 155) to capacitive sensor pattern 125 and/or any traces. The high temperatures can discolor or damage the sensor or traces, which is undesirable in embodiments where capacitive sensor pattern 125 and/or any traces are desired to be clear/transparent in color. It is appreciated that barrier layer 140 may not be used in all embodiments of plastic embedded capacitive sensor 100.

FIG. 2 is a front perspective view of an example plastic embedded capacitive sensor 100A, according to an embodiment. Like numbered components of plastic embedded capacitive sensor 100A are the same as those of plastic embedded capacitive sensor 100 except that a front perspective of an assembled state is shown. Plastic embedded capacitive sensor 100A has been shown as being substantially planar, but may be formed into a non-planar shape such as a curved surface of an automotive dashboard or console panel. As can be seen, components of cosmetic design 115, such as image(s) 112 and demarcation(s) 111 are visible through side 101 of plastic film 105. In one embodiment, side 101 of plastic film 105 serves as an exterior surface of plastic embedded capacitive sensor 100A. In another embodiment, plastic film 105 is configured to be removed such that a lower layer (e.g., the layer comprising cosmetic design 115 or capacitive sensor pattern 125) is exposed as the exterior surface of plastic embedded capacitive sensor 100A. It is appreciated that capacitive sensor pattern 125 is embedded, but not visible in plastic embedded capacitive sensor 100A. Likewise, those of laminate 135, barrier layer 140 (FIG. 2) and/or resin layer 145 which are used are also not visible in FIG. 2.

Figure 3A:
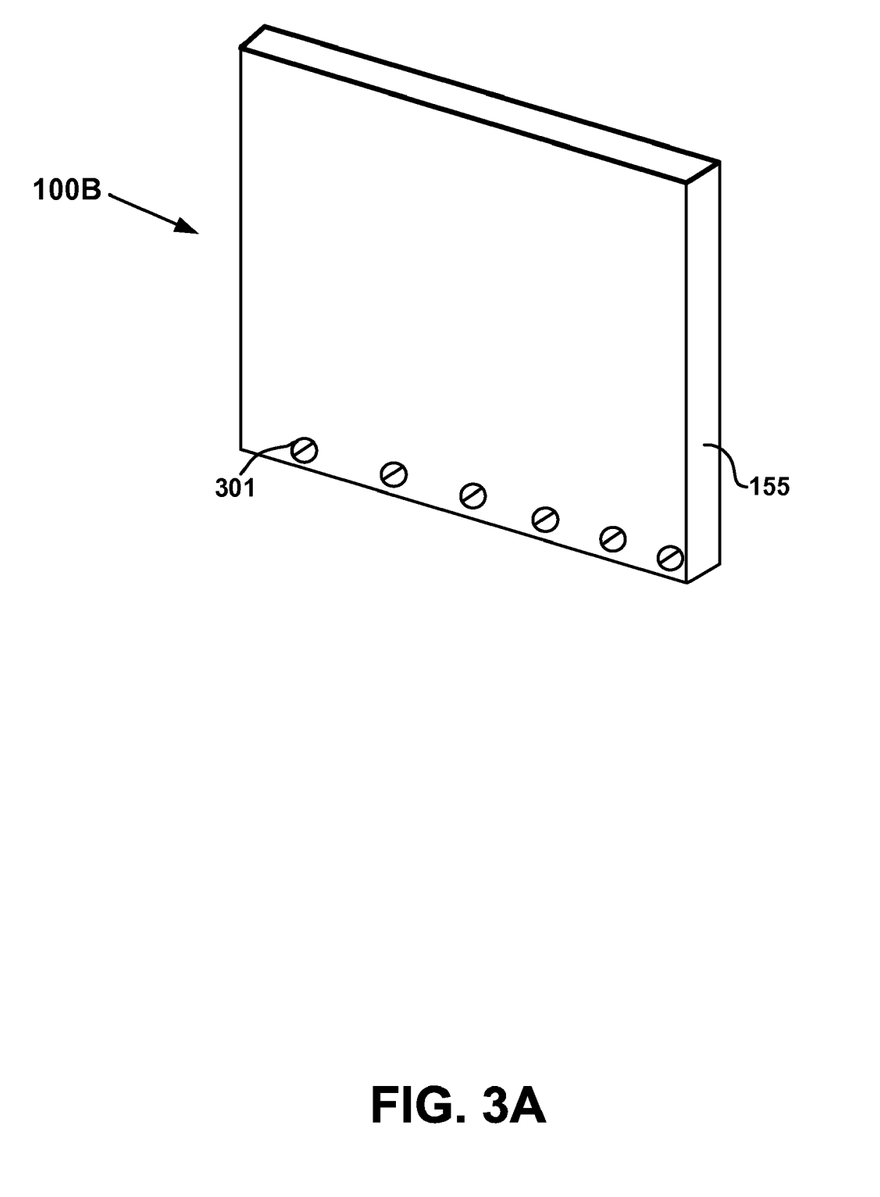
FIG. 3A is a rear perspective view of an example plastic embedded capacitive sensor, according to an embodiment.

FIG. 3A is a rear perspective view of an example plastic embedded capacitive sensor 100B, according to an embodiment. Like numbered components of plastic embedded capacitive sensor 100B are the same as those of plastic embedded capacitive sensor 100 and 100A except that a rear perspective of an assembled state is shown along with one example configuration of facilitating electrical contact to a region of capacitive sensor pattern 125. As shown in FIG. 3A, one or more openings 301 are created through injection molded plastic layer 155. Such openings can be created through molding techniques. For instance, in one embodiment, a molding core pin is used to create opening 301. The core pin is then removed after the injection molding process to leave opening 301. As previously discussed, resin layer 145 and, if utilized laminate 135, is/are purposely not disposed in the region of capacitive sensor pattern 125 which will be accessible through opening 301. In some embodiments, conductive ink is used at the region of capacitive sensor pattern 125 which will be accessible via opening 301. Although opening 301 is shown as circular, other shapes, locations, and configurations of opening 301 are possible and anticipated. Opening 301 provides an aperture which facilitates numerous means of electrical contact with capacitive sensor pattern 125, a conductive pad, and/or a trace which is disposed on the portion of capacitive sensor pattern 125 accessible via opening 301. Some examples of contact include soldering and pressure contact (e.g., a leaf spring type contact typically seen for making contact with a battery).

Figure 3B:
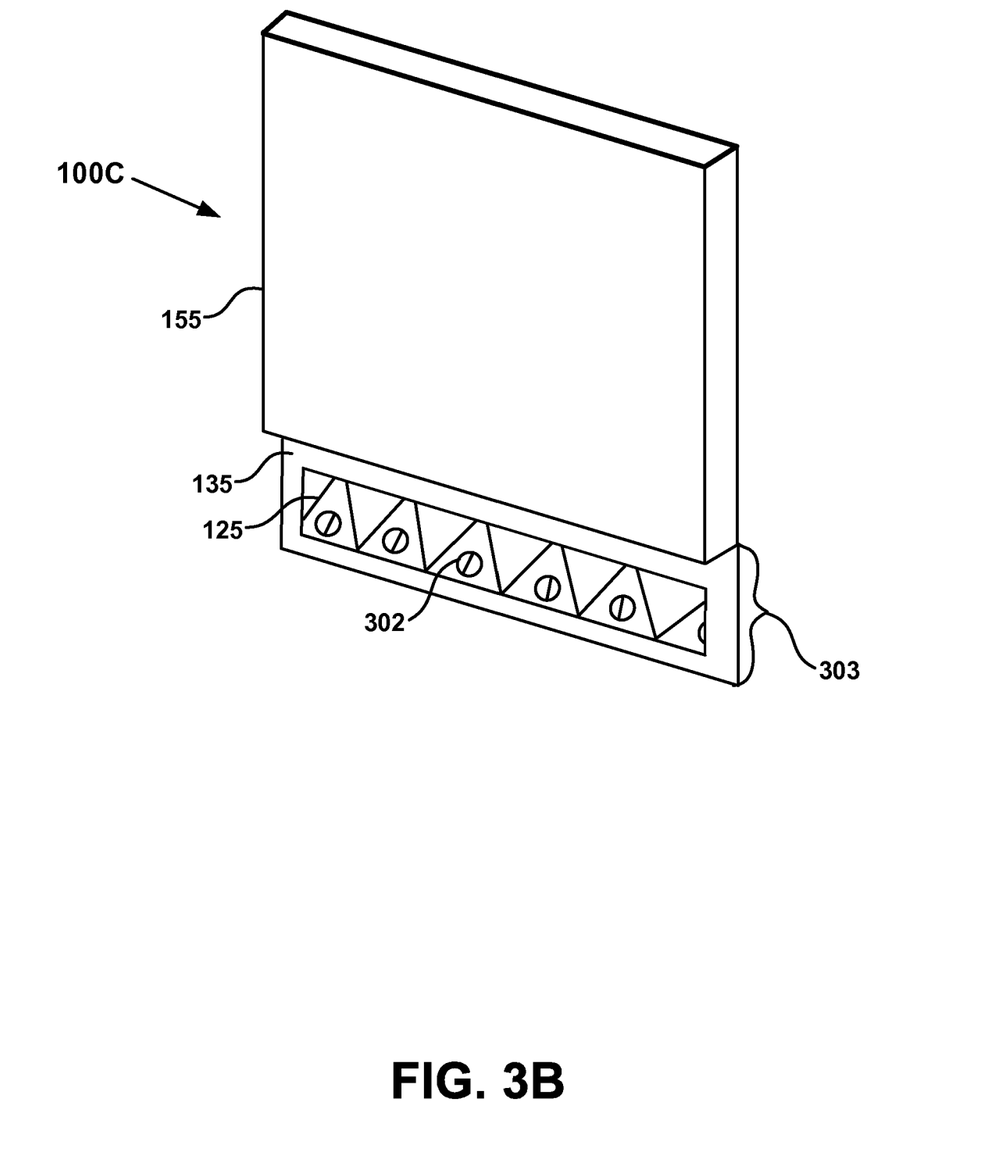
FIG. 3B is a rear perspective view of an example plastic embedded capacitive sensor, according to an embodiment.

FIG. 3B is a rear perspective view of an example plastic embedded capacitive sensor 100C, according to an embodiment. Like numbered components of plastic embedded capacitive sensor 100C are the same as those of plastic embedded capacitive sensor 100 and 100A except that a rear perspective of an assembled state is shown along with one example configuration of facilitating electrical contact to a region of capacitive sensor pattern 125. As shown in FIG. 3B, a region 303, which is not covered by injection molded plastic layer 155, provides access to capacitive sensor pattern 125. In one embodiment, region 303 comprises a portion of plastic film 105 which extends from plastic embedded capacitive sensor 100C. In one embodiment, laminate 135 is utilized in region 303 to provide extra structural stability. However, in one embodiment, neither laminate 135 nor resin layer 145 covers a region of capacitive sensor pattern 125 that is used for facilitating electrical contact. By leaving such a region of capacitive sensor pattern 125 exposed, electrical contact with the capacitive sensor pattern can easily be made. Additionally, in one embodiment, pads such as pad 302 or traces may be incorporated in region 303. In one embodiment, pad 302 comprises a region conductive material, such as conductive ink, disposed upon and/or coupled with a conductive region of capacitive sensor pattern 125. It is appreciated that in one embodiment a pad, such as pad 302, is accessible via opening 301 shown in FIG. 3A.

Figure 3C:
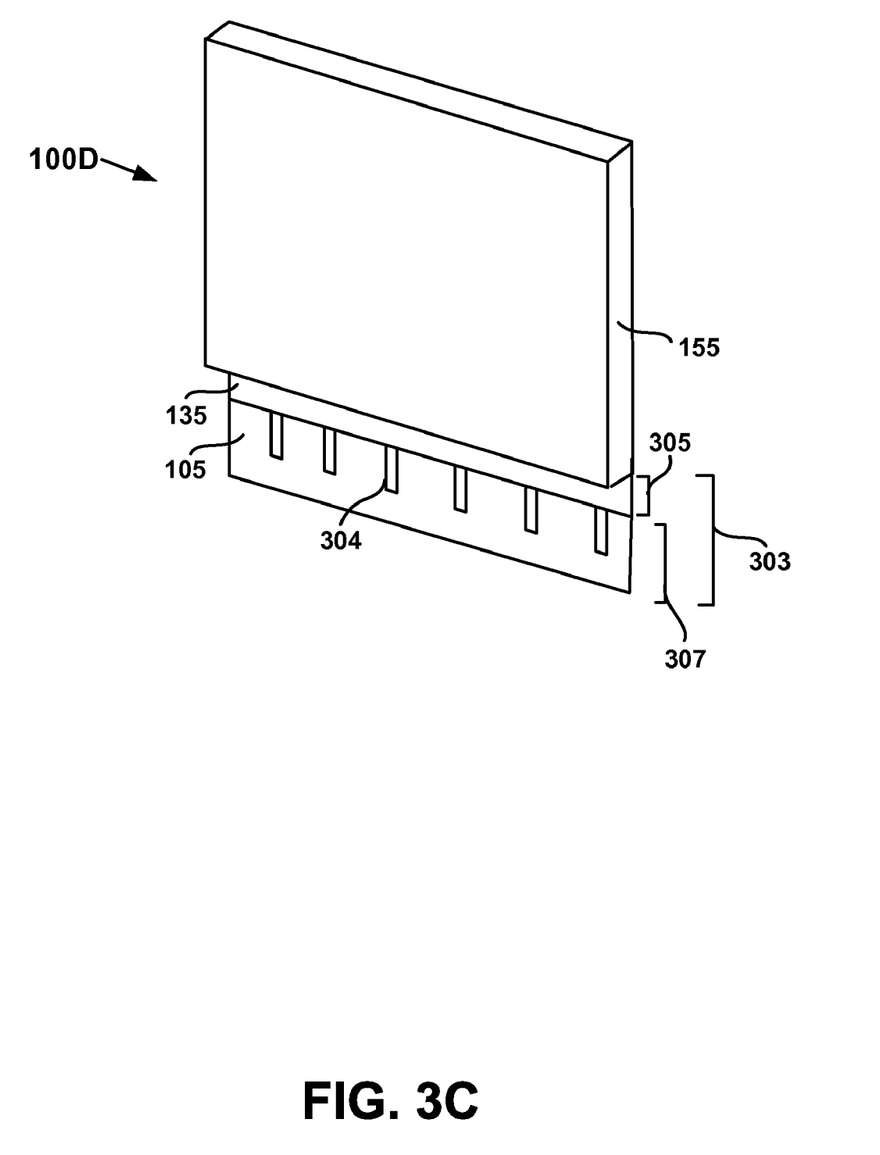
FIG. 3C is a rear perspective view of an example plastic embedded capacitive sensor, according to an embodiment.

FIG. 3C is a rear perspective view of an example plastic embedded capacitive sensor 100D, according to an embodiment. Like numbered components of plastic embedded capacitive sensor 100D are the same as those of plastic embedded capacitive sensor 100 and 100A except that a rear perspective of an assembled state is shown along with one example configuration of facilitating electrical contact to a region of capacitive sensor pattern 125 (not visible). As shown in FIG. 3C, a region 303, which is not covered by injection molded plastic layer 155, provides access to one or more conductive traces, such as conductive trace 304, which is/are coupled with capacitive sensor pattern 125. In one embodiment, region 303 comprises a portion of plastic film 105 which extends from plastic embedded capacitive sensor 100D. In some embodiments, laminate 135 is utilized in all or portions of region, such as region 303, to protect the continuity of conductive traces which protrude into region 303 from beneath a region which is covered by injection molded plastic layer 155. However, in one embodiment, neither laminate 135 nor resin layer 145 covers a region (e.g. region 307) which is used for facilitating electrical contact to conductive traces, such as conductive trace 304, which are conductively coupled with capacitive sensor pattern 125. Effectively, conductive trace 304 is, in some embodiments, an extension of capacitive sensor 125 which is or can be printed simultaneously with the other portions of capacitive sensor 125. By leaving such a region of capacitive sensor pattern 125 exposed, electrical contact with conductive trace 304 can easily be made. Additionally, in one embodiment, pads such as pad 302 (see FIG. 3B) may be incorporated in region 303, such as on trace 304. In one embodiment, trace 304 comprises a region conductive material, such as conductive ink, which is coupled with a conductive region of capacitive sensor pattern 125. It is appreciated that in one embodiment a trace, such as trace 304, is accessible via opening 301 shown in FIG. 3A. In one embodiment, laminate 135 may extend only slightly into region 303, such as into only region 305, to provide structural stability and to prevent/reduce stress, cracking, warping, and or bending of pads and/or traces near the juncture where the pads/traces extend out from beneath plastic layer 155.

Figure 3D:
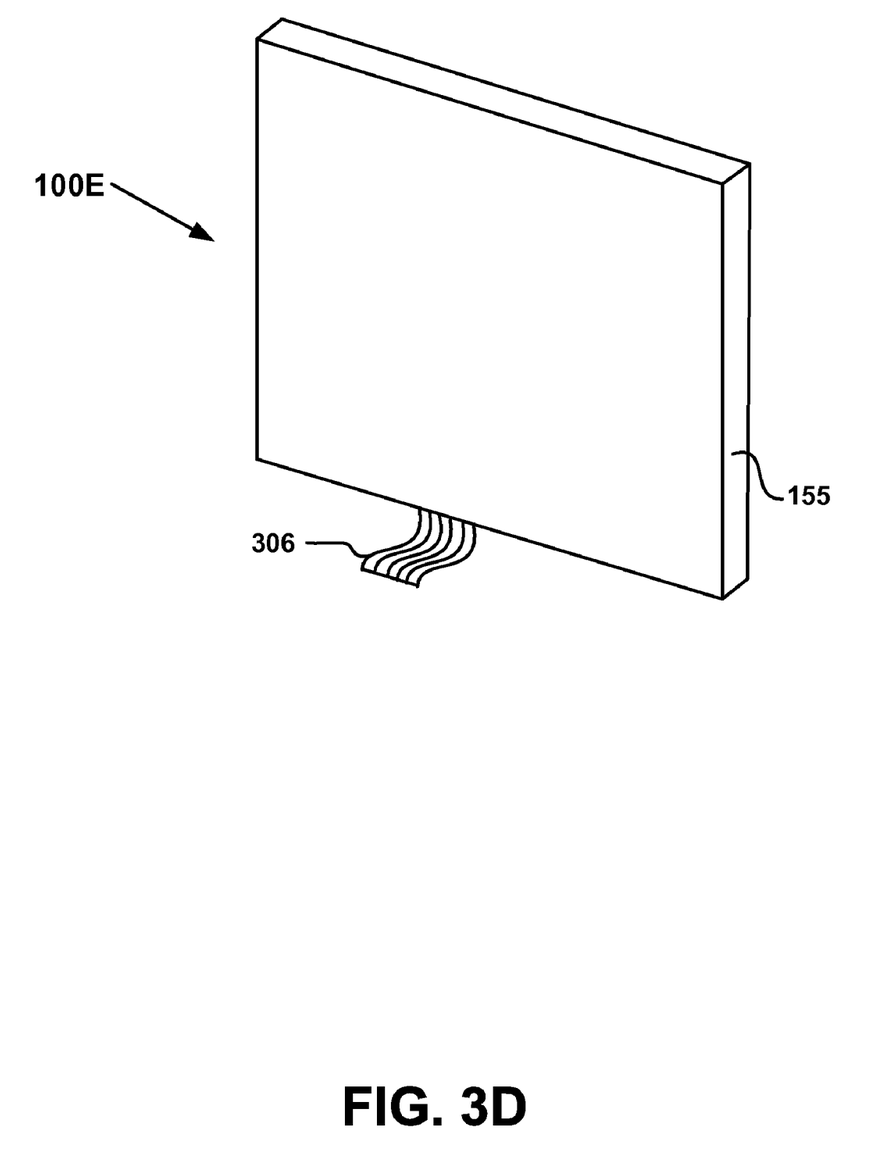
FIG. 3D is a rear perspective view of an example plastic embedded capacitive sensor, according to an embodiment.

FIG. 3D is a rear perspective view of an example plastic embedded capacitive sensor 100E, according to an embodiment. Like numbered components of plastic embedded capacitive sensor 100E are the same as those of plastic embedded capacitive sensor 100 and 100A except that a rear perspective of an assembled state is shown along with one example configuration of facilitating electrical contact to a region of capacitive sensor pattern 125. As shown by FIG. 3D, a film tail 306 with conductive traces extends from plastic embedded capacitive sensor 100E. The conductive traces of film tail 306 are coupled with conductive regions of capacitive sensor pattern 125. The conductive traces of film tail 306 are accessible and allow for electrically coupling with capacitive sensor pattern 125. In one embodiment film tail 306 is molded from plastic film 105 and the traces which couple to capacitive sensor pattern 125 are printed directly onto plastic film 105.

EXAMPLE ELECTRONIC APPARATUS

Figure 4:
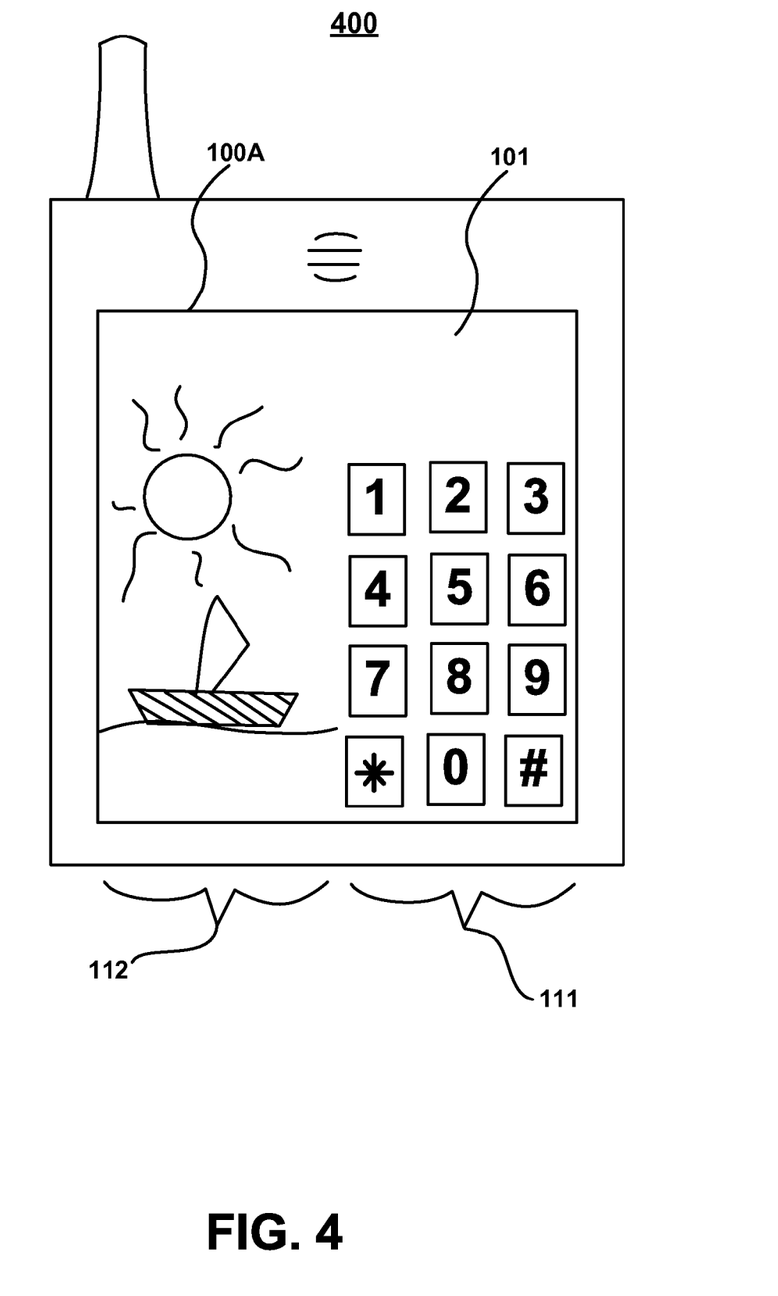
FIG. 4 shows an example electronic apparatus configured with an example plastic embedded capacitive sensor.

FIG. 4 shows an example electronic apparatus 400 configured with an example plastic embedded capacitive sensor, such as plastic embedded capacitive sensor 100A. Although a particular form factor of example electronic apparatus 400 has been shown, this form factor has been shown for purposes of example and not of limitation. In one embodiment, plastic embedded capacitive sensor 100A is can disposed over a display, such as a liquid crystal display. When transparent or clear materials are used, in the construction of plastic embedded capacitive sensor 100A, items displayed on the display of electronic apparatus 400 will be visible or substantially visible when viewed through an exterior surface, such as side 101, of plastic embedded capacitive sensor 100A. If a cosmetic design is included in plastic embedded capacitive sensor 100A, elements of the cosmetic design will be visible. For example, image 112 is visible as are demarcations 111. Image 112 provides an aesthetic quality, while demarcations 111 provide indicia which guide a user to provide certain touch/proximity inputs in particular designated regions of the exterior surface of plastic embedded capacitive sensor 100A.

Forming an In-Molded Capacitive Sensing Device

Figure 5A:
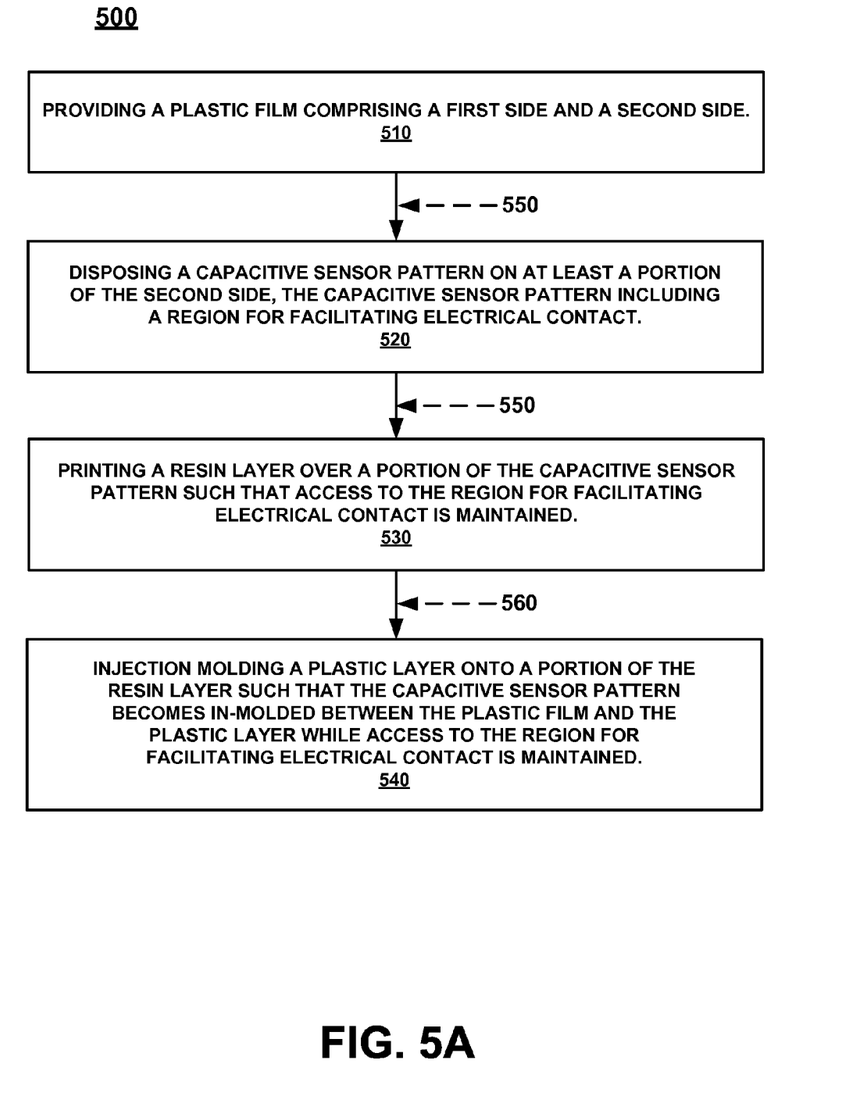
FIG. 5A is a flow diagram of a method for forming an in-molded capacitive sensing device, according to an embodiment.
Figure 5B:
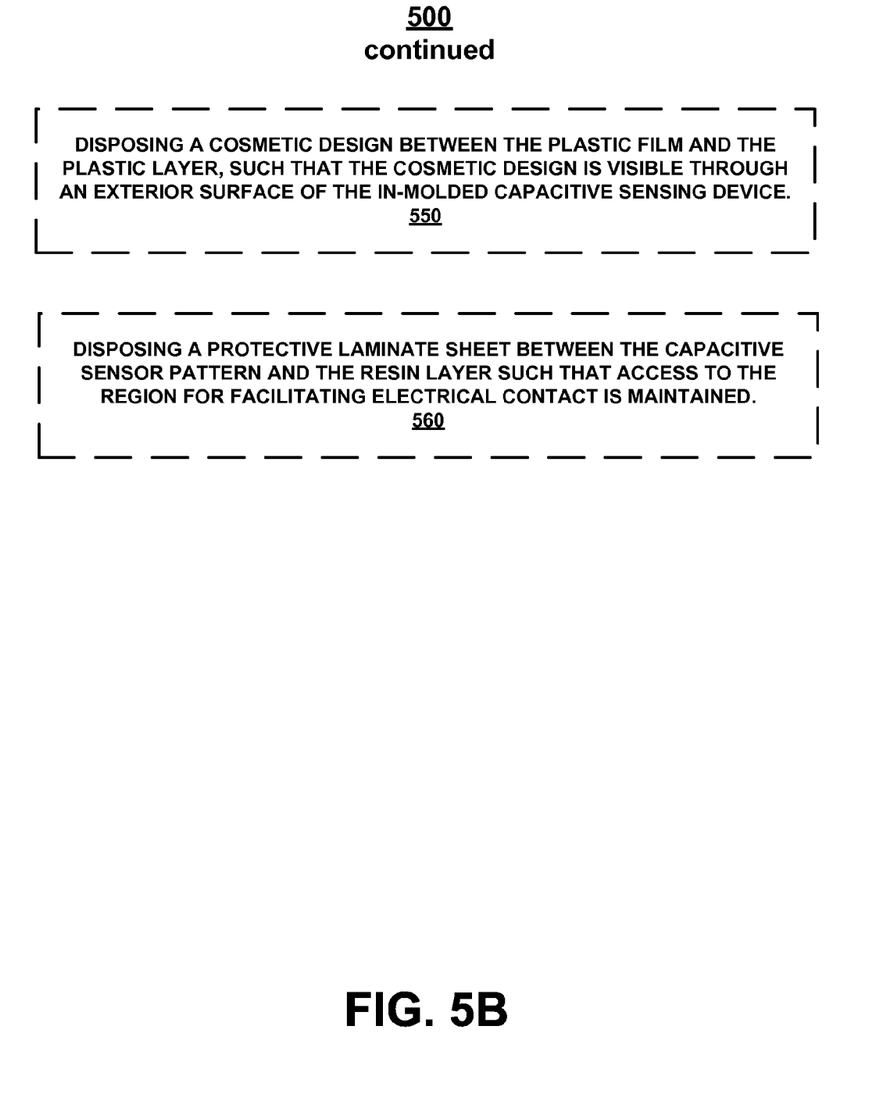
FIG. 5B is a continuation of the flow diagram of FIG. 5A and shows additional portions of the method for forming an in-molded capacitive sensing device, according to various embodiments.

FIG. 5A is a flow diagram 500 of a method for forming an in-molded capacitive sensing device, according to an embodiment. FIG. 5B is a continuation of flow diagram 500 of FIG. 5A and shows additional portions of the method for forming an in-molded capacitive sensing device, according to various embodiments. In description of flow diagram 500, reference will be made to plastic embedded capacitive sensor 100 (FIGS. 1A and 1B), plastic embedded capacitive sensor 100A (FIG. 2), plastic embedded capacitive sensor 100B (FIG. 3A), plastic embedded capacitive sensor 100C (FIG. 3B), plastic embedded capacitive sensor 100D (FIG. 3C), and plastic embedded capacitive sensor 100E (FIG. 3D).

With reference to flow diagram 500, in 510, in one embodiment, the method provides a plastic film comprising a first side and a second side. For example, with reference to FIG. 1A, in one embodiment, this comprises providing plastic film 105, with a first side (side 101) and a second side (side 102). In one embodiment, as shown in FIG. 2, plastic film 105 is configured to be removable from the in-molded capacitive sensing device subsequent to injection molding. For example, as shown in FIG. 2, plastic film 105 can be configured to be peeled away to expose a lower layer of construction of plastic embedded capacitive sensor 100A.

In 520, in one embodiment, the method disposes a capacitive sensor pattern on at least a portion of the second side. The capacitive sensor pattern includes a region for facilitating electrical contact. This comprises disposing a capacitive sensing pattern such as capacitive sensor pattern 125 onto all or a portion of side 102 using a technique such a printing, sputtering, or some other technique. Several examples of regions for facilitation electrical contact are shown in plastic embedded capacitive sensors 100B, 100C, 100D, and 100E. Such examples include a designated region of capacitive sensor pattern 125 which will be used for electrical contact, conductive pads (e.g., pad 302), and conductive traces (e.g., trace 304). As previously described, in various embodiments, capacitive sensor pattern 125 is disposed using transparent conductive material and/or transparent insulating material. When multiple conductive layers are used to form capacitive sensor pattern 125, these conductive layers may be laminated or printed, and can include disposing at least one dielectric layer between a portion of the multiple conductive layers. It is appreciated that a greater or lesser number of layers can be utilized to form capacitive sensor pattern 125.

In 530, in one embodiment, the method prints a resin layer over a portion of the capacitive sensor pattern such that access to the region for facilitating electrical contact is maintained. For example, this can comprise printing resin layer 145 over capacitive sensor pattern 125 while masking off the region of capacitive sensor pattern 125 which will be used for electrical contact, so that resin layer 145 is not printed over this region. In some embodiments, where laminate 135 and/or barrier layer 140 are used, this comprises printing resin of resin layer 145 over all or portions of such intervening layers which are exposed and are already layered upon all or a portion of capacitive sensor pattern 125 and which are to be covered with injection molded plastic layer 155.

In 540, in one embodiment, the method injection molds a plastic layer onto a portion of the resin layer such that the capacitive sensor pattern becomes in-molded between the plastic film and the plastic layer while access to the region for facilitating electrical contact is maintained. For example, this can comprise injection molding of injection molded plastic layer 155 such that a plurality of layers (e.g., resin layer 145, capacitive sensor pattern 125, and optionally cosmetic design 115 and/or laminate 135 and/or barrier layer 140) are sandwiched between side 102 of plastic film 105 and injection molded plastic layer 155.

A variety of techniques may be used to maintain access to the region of capacitive sensor pattern 125 which is used for facilitating electrical contact. Several examples of such techniques are shown in FIGS. 3A, 3B, 3C, and 3D. For example, as shown in the embodiment of FIG. 3A, this access can be maintained by injection molding the injection molded plastic layer 155 around core pins positioned such that an aperture (e.g., opening 301) is created through injection molded plastic layer 155 to the region for facilitating electrical contact. In another example, as shown in the embodiments of FIGS. 3B and 3C, this access can be maintained by injection molding injection molded plastic layer 155 such that access to the region for facilitating electrical contact is provided in an extended edge region (e.g., edge region 303) of side 102 of plastic film 105 which is not covered by injection molded plastic layer 155. In yet another example, as shown in the embodiment of FIG. 3D, the access can be maintained by incorporating a film tail 306 which is coupled to capacitive sensor pattern 125.

In 550, in one embodiment, the method illustrated by flow diagram 500 also comprises involves disposing a cosmetic design between the plastic film and the injection molded plastic layer, such that the cosmetic design is visible through an exterior surface of the in-molded/embedded capacitive sensing device. FIG. 2 shows an example plastic embedded capacitive sensor 100A where components of cosmetic design 115 are visible through the exterior surface. Typically, the cosmetic design is disposed either between capacitive sensor pattern 125 and side 102 of plastic film 105, or on top of capacitive sensor pattern 125 (such as between resin layer 145 and capacitive sensor pattern 125).

In 560, in one embodiment, the method involves disposing a protective laminate sheet such that access to the region for facilitating electrical contact is maintained. This can involve disposing laminate 135 between capacitive sensor pattern 125 and resin layer 145. For example, this can comprise disposing laminate 135 over a region of capacitive sensor pattern 125, so that laminate 135 protects a region for facilitating electrical contact with capacitive sensor pattern 125. This can also comprise cutting out or etching away the region of laminate 135 which will be located over the region of capacitive sensor pattern 125 which will be used for electrical contact so that laminate 135 does cover this region of capacitive sensor pattern 125.

Creating a Plastic Embedded Capacitive Sensor

Figure 6:
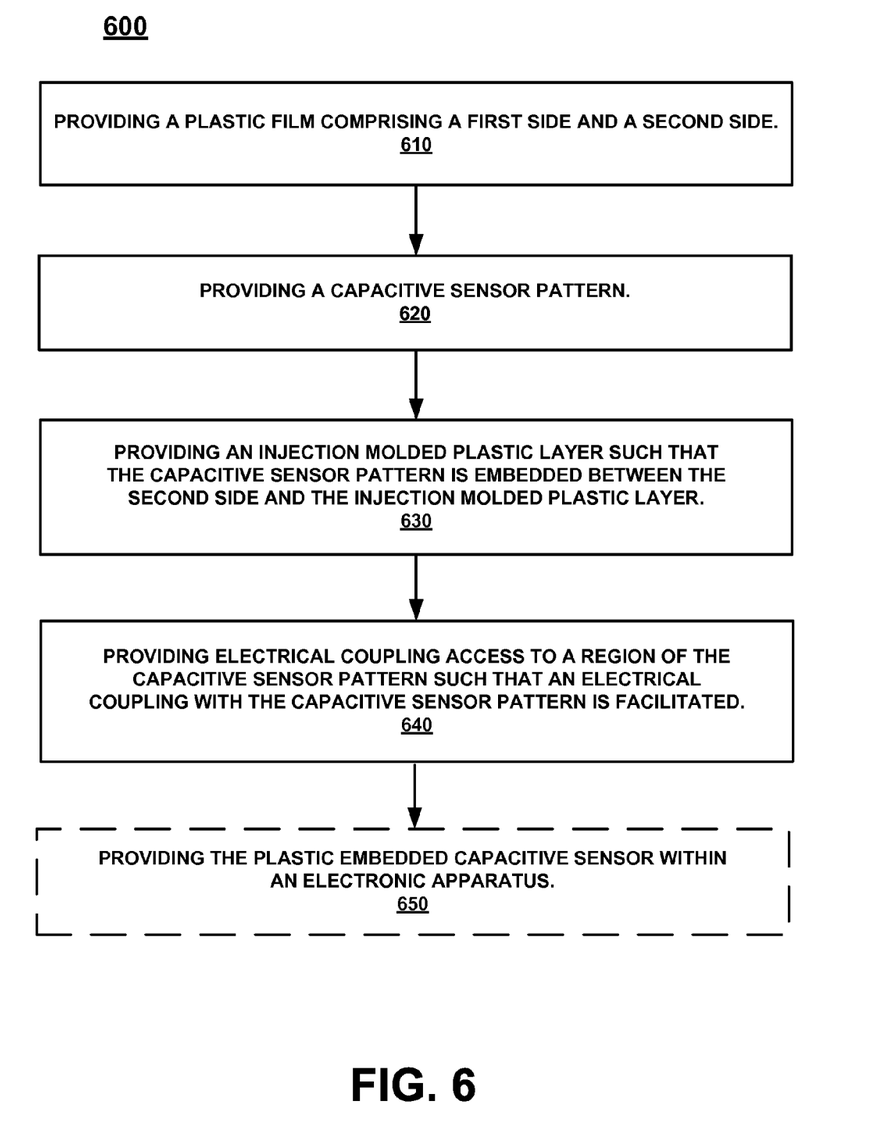
FIG. 6 is a flow diagram of a process for creating a plastic embedded capacitive sensor, according to an embodiment.

FIG. 6 is a flow diagram 600 of a process for creating a plastic embedded capacitive sensor, according to an embodiment. In description of process of flow diagram 600, reference will be made to in-molded/plastic embedded capacitive sensor 100 (FIGS. 1A and 1B) and in-molded/plastic embedded capacitive sensor 100A (FIG. 2), plastic embedded capacitive sensor 100B (FIG. 3A), plastic embedded capacitive sensor 100C (FIG. 3B), plastic embedded capacitive sensor 100D (FIG. 3C), and plastic embedded capacitive sensor 100E (FIG. 3D). The providing steps described below can be performed by a manufacturer, assembler, or supplier (or some combination thereof) of an in-molded/embedded capacitive sensing device or a product containing an in-molded/plastic embedded capacitive sensor.

In 610, in one embodiment, the method provides a plastic film comprising a first side and a second side. Plastic film 105, which comprises first side (side 101) and second side (side 102), is an example of such a plastic film.

In 620, in one embodiment, the method provides a capacitive sensor pattern. Capacitive sensor pattern 125, shown in FIG. 1A, is an example of a capacitive sensor pattern which is provided.

In 630, in one embodiment, the method provides an injection molded plastic layer such that the capacitive sensor pattern is embedded between the second side and the injection molded plastic layer. Injection molded plastic layer 155, shown in FIG. 1A, is an example of an injection molded plastic layer. It is appreciated that a resin layer 145 is also embedded between the second side and the injection molded plastic layer. It is also appreciated that in some embodiments, additional layers such as a laminate 135, a barrier layer 140, and/or a cosmetic design 115 can be provided and embedded partially or completely between the second side (e.g., side 102) and injection molded plastic layer 155. Some, all, or none of these additional layers can be included depending upon the configuration of the in-molded/plastic embedded capacitive sensor.

In 640, in one embodiment, the method provides an electrical coupling access to a region of the capacitive sensor pattern such that an electrical coupling with the capacitive sensor pattern is facilitated. FIGS. 3A, 3B, 3C, and 3D show examples of such an electrical coupling access which may include an aperture (e.g., opening 301), an extended region (e.g., region 303), or a film tail with conductive traces (e.g., film tail 306).

In 650, in one embodiment, the method also comprises providing the plastic embedded capacitive sensor within a capacitive sensing electronic apparatus. Electronic apparatus 400 shows one example of an electronic apparatus in which a plastic embedded capacitive sensor, such as plastic embedded capacitive sensor 100A, is disposed.

The foregoing descriptions of specific embodiments have been presented for purposes of illustration and description. They are not intended to be exhaustive or to limit the presented technology to the precise forms disclosed, and obviously many modifications and variations are possible in light of the above teaching. The embodiments were chosen and described in order to best explain the principles of the presented technology and its practical application, to thereby enable others skilled in the art to best utilize the presented technology and various embodiments with various modifications as are suited to the particular use contemplated. It is intended that the scope of the present technology be defined by the claims appended hereto and their equivalents.

What is claimed is:

1. A plastic embedded capacitive sensor comprising:
    a plastic film comprising a first side and a second side;
    an injection molded plastic layer; and
    a capacitive sensor pattern embedded between said second side and said injection molded plastic layer such that access to a region of said capacitive sensor pattern is maintained for facilitating electrical contact with said capacitive sensor pattern.

2. The plastic embedded capacitive sensor of claim 1, further comprising:
    a laminate layer disposed between said plastic film and said injection molded layer.

3. The plastic embedded capacitive sensor of claim 1, further comprising:
    a cosmetic design disposed between said plastic film and said injection molded plastic layer, such that said cosmetic design is visible through an exterior surface of said plastic embedded capacitive sensor.

4. The plastic embedded capacitive sensor of claim 3, wherein said cosmetic design comprises:
    a demarcation related to use of said capacitive sensor pattern.

5. The plastic embedded capacitive sensor of claim 1, further comprising:
    a conductive film tail coupled to said capacitive sensor pattern and accessible for electrically coupling to said capacitive sensor pattern.

6. The plastic embedded capacitive sensor of claim 1, wherein said plastic film is configured for removal subsequent to manufacture of said plastic embedded capacitive sensor.

7. The plastic embedded capacitive sensor of claim 1, wherein said plastic film comprises a material which allows transmission of light.

8. The plastic embedded capacitive sensor of claim 1, wherein said capacitive sensor pattern comprises:
    a clear conductive material.

9. The plastic embedded capacitive sensor of claim 1, wherein said region for facilitating electrical contact comprises:
    an exposed electrical trace disposed on a portion of said second side which extends from said injection molded plastic layer.

10. The plastic embedded capacitive sensor of claim 1, wherein said region for facilitating electrical contact comprises:
    an electrical trace accessible via an aperture molded into said injection molded plastic layer.

* * * * *